(12) United States Patent
Eum et al.

(10) Patent No.: US 10,062,747 B2
(45) Date of Patent: Aug. 28, 2018

(54) SEMICONDUCTOR DEVICE

(71) Applicant: DENSO CORPORATION, Kariya, Aichi-pref. (JP)

(72) Inventors: Youngshin Eum, Kariya (JP); Kazuhiro Oyama, Kariya (JP); Yasushi Higuchi, Kariya (JP); Shinichi Hoshi, Kariya (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 15/573,200

(22) PCT Filed: Jun. 14, 2016

(86) PCT No.: PCT/JP2016/002872
§ 371 (c)(1),
(2) Date: Nov. 10, 2017

(87) PCT Pub. No.: WO2017/010041
PCT Pub. Date: Jan. 19, 2017

(65) Prior Publication Data
US 2018/0130873 A1 May 10, 2018

(30) Foreign Application Priority Data
Jul. 10, 2015 (JP) .................................. 2015-138957

(51) Int. Cl.
*H01L 29/66* (2006.01)
*H01L 29/78* (2006.01)
(Continued)

(52) U.S. Cl.
CPC .......... *H01L 29/06* (2013.01); *H01L 29/2003* (2013.01); *H01L 29/41725* (2013.01);
(Continued)

(58) Field of Classification Search
CPC ............... H01L 29/06; H01L 29/41725; H01L 29/66462; H01L 29/66431;
(Continued)

(56) References Cited

U.S. PATENT DOCUMENTS

2006/0043501 A1* 3/2006 Saito .................. H01L 29/0692
257/401
2006/0220065 A1 10/2006 Kawasaki et al.
(Continued)

FOREIGN PATENT DOCUMENTS

JP 2013-179128 A 9/2013
JP 2013-229458 A 11/2013

*Primary Examiner* — Selim Ahmed
(74) *Attorney, Agent, or Firm* — Posz Law Group, PLC

(57) ABSTRACT

In a semiconductor device, an AlGaN layer includes a first AlGaN layer and a second AlGaN layer. The second AlGaN layer is positioned between a gate structure portion and a drain electrode and is divided into multiple parts in an arrangement direction in which the gate structure portion and the drain electrode are arranged. A second Al mixed crystal ratio of the second AlGaN layer is less than a first Al mixed crystal ratio of the first AlGaN layer. Accordingly, the semiconductor device is a normally-off-type device and is capable of restricting a decrease of a breakdown voltage and an increase of an on-resistance.

10 Claims, 7 Drawing Sheets

(51) Int. Cl.
  *H01L 29/06* (2006.01)
  *H01L 29/778* (2006.01)
  *H01L 29/812* (2006.01)
  *H01L 29/20* (2006.01)
  *H01L 29/423* (2006.01)
  *H01L 29/417* (2006.01)

(52) U.S. Cl.
  CPC .. *H01L 29/42364* (2013.01); *H01L 29/66431* (2013.01); *H01L 29/66462* (2013.01); *H01L 29/778* (2013.01); *H01L 29/78* (2013.01); *H01L 29/812* (2013.01)

(58) Field of Classification Search
  CPC . H01L 29/42364; H01L 29/812; H01L 29/78; H01L 29/778; H01L 29/2003
  USPC ......................................................... 257/194
  See application file for complete search history.

(56) References Cited

U.S. PATENT DOCUMENTS

| | | | |
|---|---|---|---|
| 2011/0089468 A1* | 4/2011 | Zhang | H01L 29/42316 257/194 |
| 2012/0056191 A1 | 3/2012 | Endo et al. | |
| 2013/0146889 A1 | 6/2013 | Makiyama | |
| 2013/0175544 A1* | 7/2013 | Oishi | H01L 29/0657 257/76 |
| 2013/0306984 A1 | 11/2013 | Twynam | |
| 2014/0092637 A1* | 4/2014 | Minoura | H01L 29/408 363/17 |
| 2014/0092638 A1 | 4/2014 | Nishimori et al. | |
| 2014/0361337 A1 | 12/2014 | Sugiyama et al. | |
| 2016/0204242 A1 | 7/2016 | Makiyama | |

\* cited by examiner

SEMICONDUCTOR DEVICE

CROSS REFERENCE TO RELATED APPLICATIONS

This application is a U.S. national stage of International Patent Application No. PCT/JP2016/002872 filed on Jun. 14, 2016 and is based on Japanese Patent Application No. 2015-138957 filed on Jul. 10, 2015, the disclosures of which are incorporated herein by reference.

TECHNICAL FIELD

The present disclosure relates to a semiconductor device having a hetero-junction structure of nitride semiconductors of gallium nitride (hereinafter, referred to as GaN) and aluminum gallium nitride (hereinafter, referred to as AlGaN).

BACKGROUND ART

Conventionally, in a patent literature 1, a semiconductor device has been proposed that includes a high electron mobility transistor (hereinafter, referred to as HEMT), which is a field-effect transistor, as a horizontal switching device having a hetero-junction structure.

This kind of semiconductor device includes a horizontal HEMT having a hetero-junction structure of GaN and AlGaN. Specifically, the semiconductor device includes a GaN-type semiconductor layer in which a GaN electron transit layer and an AlGaN electron donor layer are stacked on a substrate in order. The AlGaN electron donor layer has a recess at which a thickness is thinned. The semiconductor device includes a gate electrode in the recess. The semiconductor device includes a source electrode and a drain electrode on the AlGaN electron donor layer and the gate electrode is sandwiched between the source electrode and the drain electrode. The recess is provided at a gate implant portion and an outer side of the gate implant portion. The recess includes a first recess between the gate implant portion and the source electrode and a second recess between the gate implant portion and the drain electrode.

In the HEMT, below the AlGaN electron donor layer positioned at both sides of the gate electrode, carriers of 2-dimensional electron gas (hereinafter, referred to as 2DEG) are induced by piezoelectric effect and intrinsic polarization effect. As such, the HEMT generates a current between the source and the drain through the 2DEG carriers and a channel formed at a surface layer portion of the GaN electron transit layer positioned below the gate electrode.

In the HEMT, the part of the AlGaN electron donor layer is thinned by the recess. In the part of the AlGaN electron donor layer having the recess, a stress is eased than the other thicker part. Therefore, in the AlGaN electron donor layer having the recess, an occurrence of the piezoelectric polarization is restricted and a concentration of the 2DEG (hereinafter, referred to as Ns) is reduced. Accordingly, in the AlGaN electron donor layer having the recess, decrease of a breakdown voltage is restricted. Also, when the AlGaN electron donor layer is partially thinned at multiple positions, the maximum electrical field intensity is further reduced.

PRIOR ART LITERATURE

Patent Literature

Patent literature 1: JP 509399:1 B2

SUMMARY OF INVENTION

However, it has been known that a relation between the thickness and the stress of the AlGaN electron donor layer has a criticality and the Ns is highly affected by the thickness (see FIG. 3, which will be described later). Therefore, there is a possibility that the Ns is largely changed even when the thickness of the AlGaN electron donor layer is slightly changed, and it is difficult to control the Ns. The thickness of the AlGaN electron donor layer is thinned by etching and it is difficult to control the thickness and the Ns by the etching.

It is an object of the present disclosure to provide a semiconductor device being a normally-off type device and being capable of restricting a decrease of a breakdown voltage and an increase an on-resistance in well-controlled manner.

According to an aspect of the present disclosure, a semiconductor device includes a horizontal switching device. The horizontal switching device includes a substrate, a channel forming layer, a gate structure portion, a source electrode and a drain electrode. The substrate is formed of a semi-insulator or a semiconductor. The channel forming layer is disposed on the substrate and has a hetero-junction structure of a GaN layer and an AlGaN layer. The GaN layer provides an electron transit layer and the AlGaN layer provides an electron donor layer. The channel forming layer has a recess at which the AlGaN layer is partially removed. The gate structure portion has a gate insulation film and a gate electrode. The gate insulation film is disposed in the recess and the gale electrode is disposed on the gate insulation film. The source electrode and the drain electrode are disposed on the channel forming layer and the gate structure portion is positioned between the source electrode and the drain electrode. The horizontal switching device generates a current between the source electrode and the drain electrode by a channel formed at a surface layer portion of the GaN layer positioned below a bottom of the recess when a 2-dimensional electron gas carrier is induced in the GaN layer adjacent to an interface between the GaN layer and the AlGaN layer and a voltage is applied to the gate electrode.

In the above configuration, the AlGaN layer includes a first AlGaN layer and a second AlGaN layer. The first AlGaN layer has a first Al mixed crystal ratio determining a 2-dimensional electron gas concentration of the first AlGaN layer. The second AlGaN layer is positioned between the gate structure portion and the drain electrode, and is divided into multiple parts in an arrangement direction in which the gate structure portion and the drain electrode are arranged. The second AlGaN layer has a second Al mixed crystal ratio determining a 2-dimensional electron gas concentration of the second AlGaN layer. The second Al mixed crystal ratio is less than the first Al mixed crystal ratio so that the second AlGaN layer induces a minus fixed charge.

According to the configuration, the semiconductor device is a normally-off-type device and is capable of restricting a decrease of a breakdown voltage and an increase of an on-resistance.

BRIEF DESCRIPTION OF DRAWINGS

The above and other objects, features and advantages of the present disclosure will become more apparent from the following detailed description made with reference to the accompanying drawings, in which.

DESCRIPTION OF EMBODIMENTS

Hereinafter, embodiments of the present disclosure will be described with reference to the drawings. In the following embodiments, parts that are the same and equal to each other are designed by the same symbols.

(First Embodiment)

Figure 1:
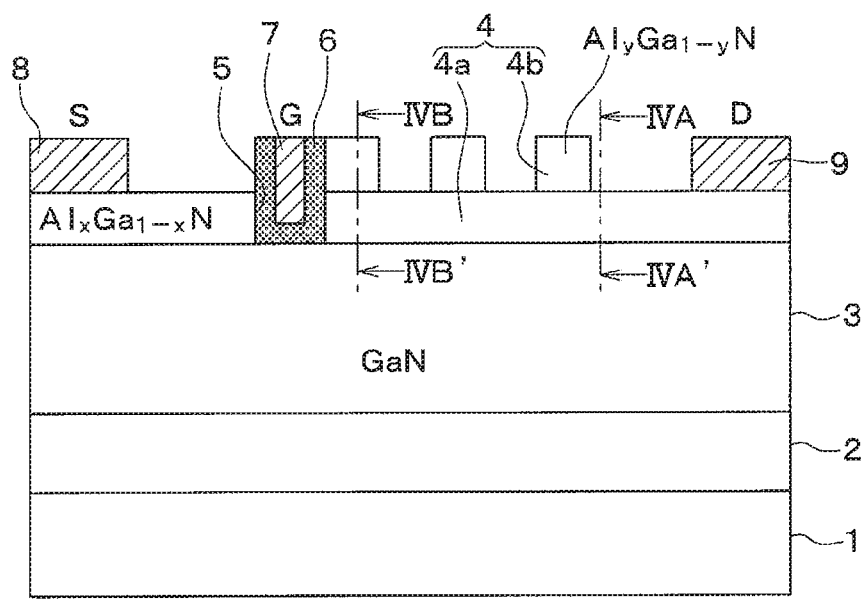
FIG. 1 is a cross-sectional view of a semiconductor device having a horizontal HEMT according to a first embodiment of the present disclosure.

A semiconductor device according to the present embodiment will be described with reference to FIG. 1. As shown in FIG. 1, the semiconductor device according to the present embodiment includes a horizontal HEMT as a switching device.

The horizontal HEMT of the present embodiment includes a compound semiconductor substrate in which i, n, or p-type GaN layer 3 is disposed on a surface of a board 1 through a buffer layer 2. On the surface of the GaN layer 3, an AlGaN layer 4 in which a first AlGaN layer 4a and a second AlGaN layer 4b are stacked is formed. The GaN layer 3 and the AlGaN layer 4 provide a hetero-junction structure. The GaN layer 3 and the AlGaN layer 4 serve as a channel forming layer. The horizontal HEMT operates when a 2DEG carrier is induced in the GaN layer 3 adjacent to an AlGaN/GaN interface by piezoelectric effect and intrinsic polarization effect.

The board 1 is formed of a semi-insulator material or a semiconductor material such as Si(111), SiC or sapphire. The buffer layer 2 is formed on the board 1 to serve as a base film for forming a film of the GaN layer 3 with good crystallinity. For example, the buffer layer 2 is formed of AlGaN—GaN superlattice layer. When the film of the GaN layer 3 is formed on the board 1 with the good crystallinity, the buffer layer 2 may be omitted. The above crystallinity means a value that affects electrical or optical characteristics such as defects or dislocations in the GaN layer 3.

The GaN layer 3 and the AlGaN layer 4 are formed on the buffer layer 2, for example, by hetero-epitaxial growth.

The GaN layer 3 provides an electron transit layer formed of a GaN-type semiconductor material such as i-GaN, n-GaN or p-GaN.

Figure 2:
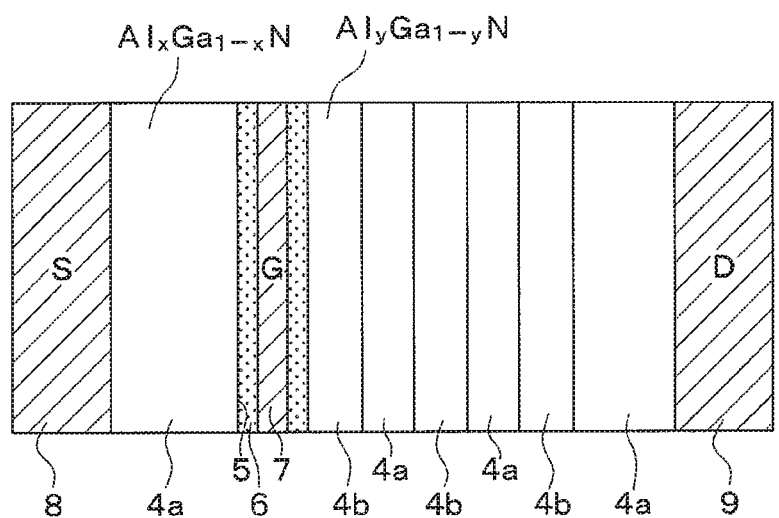
FIG. 2 is a top layout view of the semiconductor device of FIG. 1.

The AlGaN layer 4 is formed of a semiconductor material having a bandgap energy greater than the GaN-type semiconductor material of the GaN layer 3. The AlGaN layer 4 provides a barrier layer serving as an electron donor. In the present embodiment, the AlGaN layer 4 includes the first AlGaN layer 4a and the second AlGaN layer 4b, and a recess 5 in which a gate structure portion is to be implanted is formed to penetrate the first AlGaN layer 4a and the second AlGaN layer 4b. The recess 5 is provided in a line pattern extending in one direction parallel to the surface of the board 1. Specifically, the recess 5 is provided in a line pattern extending in a vertical direction of a paper of FIG. 2 (corresponding to a normal direction of a paper of FIG. 1).

The first AlGaN layer 4a is formed of $Al_xGa_{1-x}N$ in which x represents Al mixed crystal ratio. The second AlGaN layer 4b is formed of $Al_yGa_{1-y}N$ in which y represents Al mixed crystal ratio. The Al mixed crystal ratio x of the first AlGaN layer 4a is greater than the Al mixed crystal ratio y of the second AlGaN layer 4b. When the Al mixed crystal ratios x and y of the first AlGaN layer 4a and the second AlGaN layer 4b are set as described above, a minus fixed charge is induced without generating a 2-dimensional hole gas (hereinafter, referred to as 2DHG). Each of the first AlGaN layer 4a and the second AlGaN layer 4b has a thickness in which Ns (which is the 2DEG concentration) is unambiguously determined by the Al mixed crystal ratio.

Figure 3:
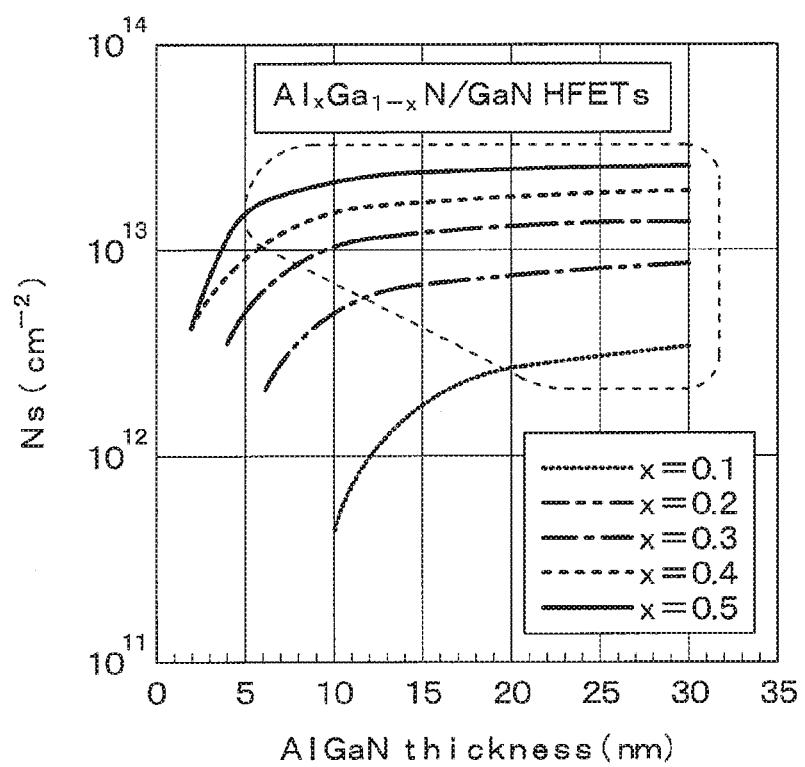
FIG. 3 is a diagram illustrating a relationship between an Al mixed crystal ratio, a thickness of an AlGaN layer and an Ns.

The thickness of a single layer of the AlGaN layer and the Ns have a relationship shown in FIG. 3. In a region in which the AlGaN layer is thin, the Ns varies largely. In a region in which the AlGaN layer has a certain thickness (which is surrounded by a broken line in FIG. 3), the Ns does not depend on the thickness of the AlGaN layer, but the Ns is unambiguously determined by the Al mixed crystal ratio. Accordingly, each of the first AlGaN layer 4a and the second AlGaN layer 4b has the thickness in which the Ns does not vary largely depending on the thickness, but the Ns is unambiguously determined by the Al mixed crystal ratio.

The first AlGaN layer 4a is formed on the entire upper surface of the board 1 and is removed in the recess 5. The second AlGaN layer 4b is formed on an upper surface of the first AlGaN layer 4a and is positioned between the gate structure portion and a drain electrode 9, which will be described later. The second AlGaN layer 4b is divided into multiple parts in an arrangement direction in which the gate structure portion and the drain electrode 9 are arranged. In the present embodiment, the second AlGaN layer 4b is positioned with a constant distance from the recess 5, that is, a side surface of the gate structure portion. Similarly to the recess 5, each part of the second AlGaN layer 4b is provided in the line pattern extending in the vertical direction of the paper of FIG. 3. Therefore, the second AlGaN layer 4b is provided in a stripe pattern when viewed from above. Each part of the second AlGaN layer 4b may have an arbitrary width. In the present embodiment, each part of the second AlGaN layer 4b has the same width.

In the recess 5, a gate electrode 7 is implanted through a gate insulation film 6 as the gate structure portion. Specifically, the gate insulation film 6 having a specific thickness is formed on an inner wall surface of the recess 5. The gate electrode 7 is formed on the gate insulation film 6. In this way, the gate structure portion is provided.

For example, the gate insulation film 6 is formed of a silicon oxide film ($SiO_2$) and an alumina ($Al_2O_3$). The gate electrode 7 is formed of a poly-semiconductor in which a metal such as aluminum, platinum and the like, or an impurity is doped. The gate insulation film 6 and the gate electrode 7 are formed in the recess 5, and thereby to provide the gate structure portion having a MOS structure.

On the other hand, at the both sides of the gate structure portion on the surface of the first AlGaN layer 4a, a source electrode 8 and the drain electrode 9 are formed apart from the second AlGaN layer 4b. The source electrode 8 and the drain electrode 9 are in ohmic-contact with the first AlGaN layer 4a. According to the above described configuration, the horizontal HEMT of the present embodiment is provided.

Although not illustrated, on the surface of the gate electrode 7, the source electrode 8 and the drain electrode 9, a gate wiring layer, a source wiring layer and a drain wiring layer formed of Al and the like are formed. The gate wiring layer, the source wiring layer and the drain wiring layer are electrically separated from each other by an inter-layer insulation film and apply arbitral voltage to the electrodes.

As described above, in the semiconductor device of the present embodiment, the GaN layer 3 and the AlGaN layer 4 provides the hetero-junction structure, and the AlGaN layer 4 includes the first AlGaN layer 4a and the second AlGaN layer 4b having different Al mixed crystal ratios. The lower first AlGaN layer 4a has the Al mixed crystal ratio greater than the upper second AlGaN layer 4b, and the second AlGaN layer 4b are divided into multiple parts between the gate structure portion and the drain electrode 9.

The first AlGaN layer 4a and the second AlGaN layer 4b have the thickness in which the Ns is unambiguously determined by the Al mixed crystal ratio. Energy bands and a carrier concentration of thermal equilibrium state in IVA-IVA' cross section and IVB-IVB' cross section of FIG. 1 are shown in FIG. 4A and FIG. 4B.

Figure 4A:
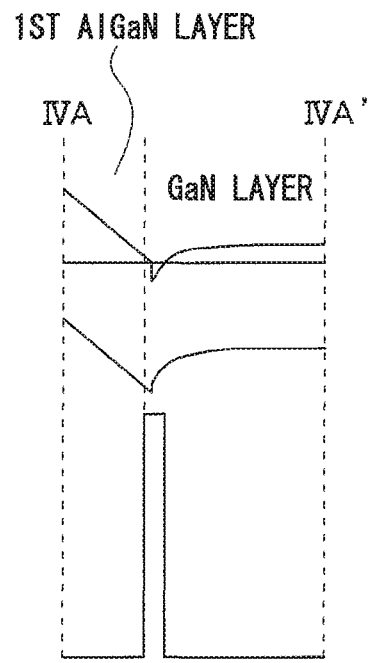
FIG. 4A is a diagram illustrating energy bands and a carrier concentration in a cross-section taken along a line IVA-IVA' of FIG. 1.

As shown in FIG. 4A, at a portion including only the first AlGaN layer 4a formed on the GaN layer 3, energy bands of a conductive band and a valence band at a boundary between the first AlGaN layer 4a and the GaN layer 3 protrudes below. Minus charges gather at the surface layer portion of the GaN layer 3 due to plus fixed charges existing largely in the first AlGaN layer 4a being in contact with the GaN layer 3. Accordingly, a carrier concentration, that is, the Ns is increased.

Figure 4B:
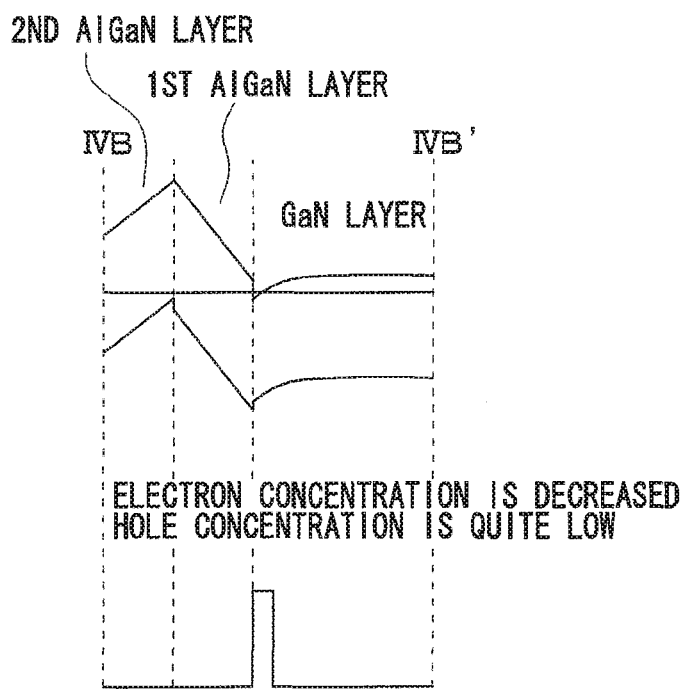
FIG. 4B is a diagram illustrating energy bands and a carrier concentration in a cross-section taken along a line IVB-IVB' of FIG. 1.

On the other hand, as shown in FIG. 4B, at a portion including the first AlGaN layer 4a and the second AlGaN layer 4b formed on the GaN layer 3, minus fixed charges are induced at the surface layer portion of the first AlGaN layer 4a adjacent to an interface between the first AlGaN layer 4a and the second AlGaN layer 4b due to the second AlGaN layer 4b. That is, since the second AlGaN layer 4b has lower Al mixed crystal ratio than the first AlGaN layer 4a, the minus fixed charges are induced at the surface layer portion of the first AlGaN layer 4a. Additionally, the Al mixed crystal ratio of the second AlGaN layer 4b is set so that 2-dimensional hole gas (hereinafter, referred to as 2DHG) is not generated. Therefore, compared to FIG. 4A, a value subtracting the minus fixed charges from the plus fixed charges in the first AlGaN layer 4a is decreased, and the charge concentration Ns of the minus electrons gathering at the surface layer portion of the GaN layer 3 is decreased.

Figure 5A:
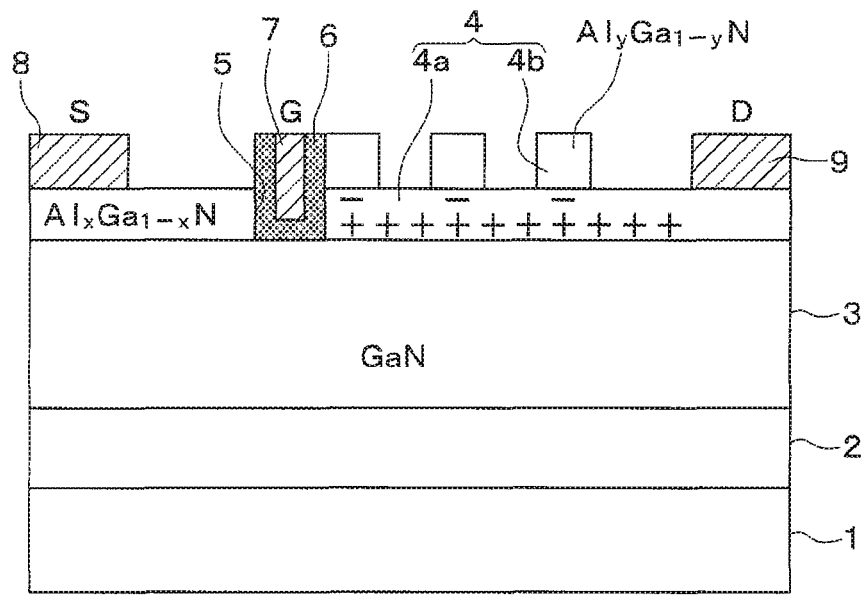
FIG. 5A is a cross-sectional view illustrating a distribution of space charges of the horizontal HEMT in a blocking state.

In a blocking state, the fixed charges operate as shown in FIG. 5A. Specifically, at the portion including the second AlGaN layer 4b on the first AlGaN layer 4a, the minus fixed charges exist at the surface layer portion of the first AlGaN layer 4a and the plus fixed charges positioned below the first AlGaN layer 4a are effectively cancelled. In this case, an electrical field intensity at a region around the gate is decreased. On the other hand, at the portion including only the first AlGaN layer 4a on the GaN layer 3, an electrical field intensity at a region around the drain is decreased due to largely existing plus fixed charges. Accordingly, the semiconductor device does not have the portion in which the electrical field intensity is locally increased, and the breakdown voltage is improved. Also, since the 2DEG is not generated below the gate structure portion, the semiconductor device is the normally-off-type device.

Figure 5B:
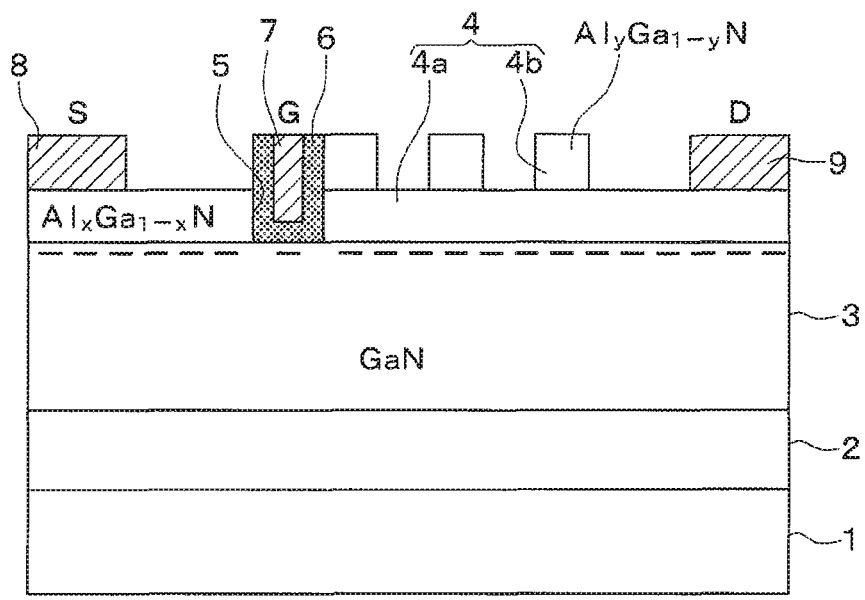
FIG. 5B is a cross-sectional view illustrating a distribution of electrons of the horizontal HEMT in an on state.

In an on state (conduction state), as shown in FIG. 5B, a channel is formed at the surface layer portion of the GaN layer 3 by the 2DEG. As such, the current flows between the source and the drain. At the portion including the second AlGaN layer 4b on the first AlGaN layer 4a, compared to the portion only including the first AlGaN layer 4a, the number of the electrons serving as the carriers (i.e., the number of the 2DEG carriers) is decreased. Therefore, when the region including the second AlGaN layer 4b is broad, the on-resistance is increased. In the present embodiment, however, the second AlGaN layer 4b is formed within a predetermined width from the side surface of the recess 5 and the second AlGaN layer 4b is not formed around the source electrode 8 and the drain electrode 9. Therefore, the increase of the on-resistance is restricted as far as possible.

Figure 6:
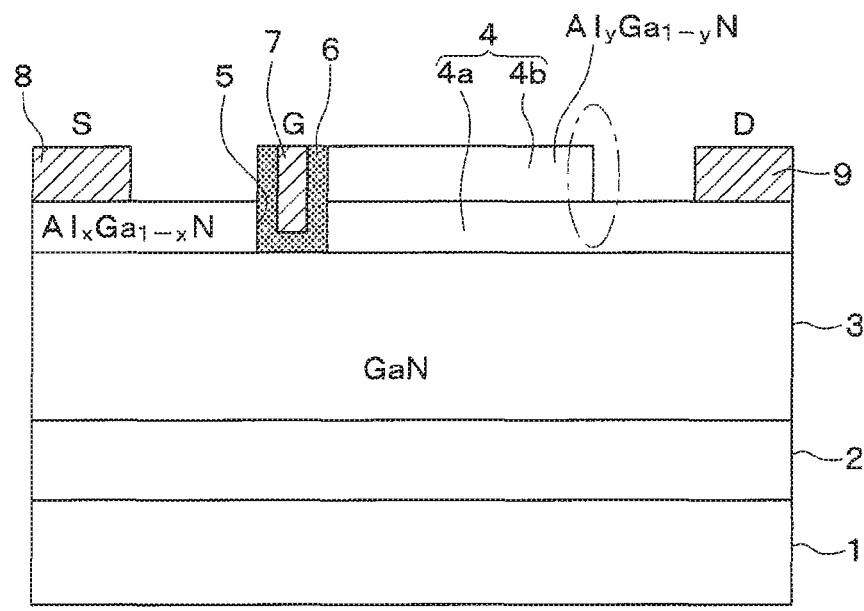
FIG. 6 is a cross-sectional view illustrating a portion at which an electrical field intensity is increased when a second AlGaN layer is continuously formed.
Figure 7:
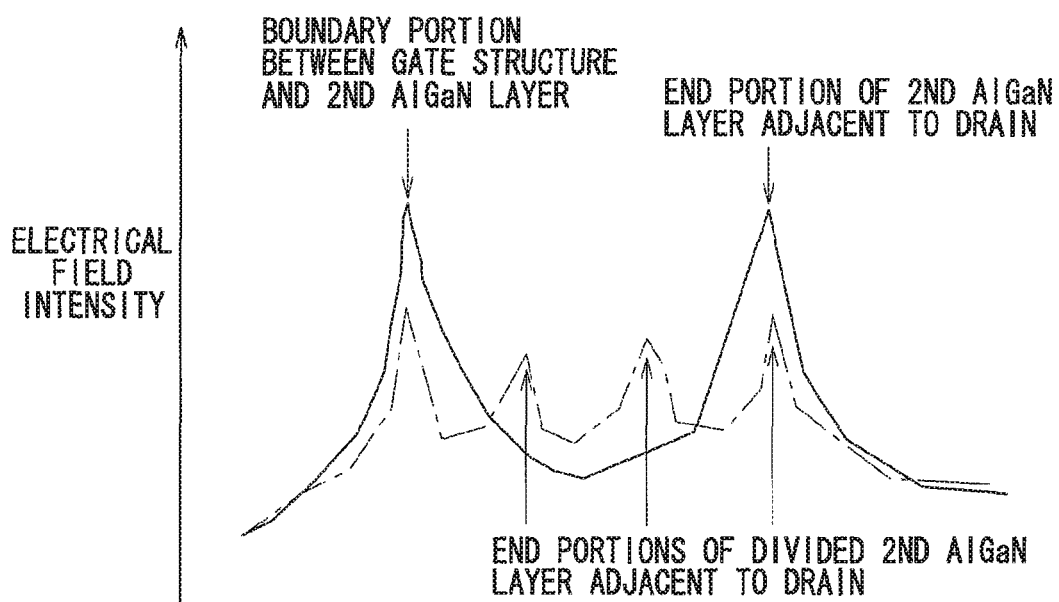
FIG. 7 is a diagram illustrating distributions of electrical field intensities when the second AlGaN layer is divided and when the second AlGaN layer is continuously formed.

As shown in FIG. 6, the semiconductor device may have a structure including only one second AlGaN layer 4b continuously formed between the gate structure portion and the drain electrode 9. In this case, however, as shown by a solid line in FIG. 7, the electrical field intensity is increased at a region surrounded by a dashed-dotted line of FIG. 6, that is, at the end portion of the second AlGaN layer 4b adjacent to the drain electrode 9, in addition to the boundary portion between the gate structure portion and the second AlGaN layer 4b. In this case, the electrical field intensity is eased in well-controlled manner by forming the second AlGaN layer 4b having the desired thickness. However, the electrical field intensity is focused at the portion in which the Ns largely varies, such as the end portion of the second AlGaN layer 4b adjacent to the drain electrode 9. Accordingly, the breakdown voltage is not sufficiently improved.

On the other hand, in the present embodiment, the second AlGaN layer 4b is divided into multiple parts and the Ns largely varies at each part of the divided second AlGaN layer 4b. In this case, as shown by a dashed-dotted line of FIG. 7, the electrical field intensity is increased at multiple portions. Since the electrical field intensity is increased at the multiple portions, the maximum intensity at each portion is decreased. Accordingly, the breakdown voltage is further improved compared to the structure including only one second AlGaN layer 4b as shown in FIG. 6.

As discussed above, in the present embodiment, the AlGaN layer 4 includes the first AlGaN layer 4a and the second AlGaN layer 4b. The second AlGaN layer 4b is positioned between the gate structure portion and the drain electrode 9 and the second AlGaN layer 4b is divided into multiple parts. The first AlGaN layer 4a has the Al mixed crystal ratio greater than the Al mixed crystal ratio of the second AlGaN layer 4b. According to this configuration, the semiconductor device is the normally-off-type device and the semiconductor device is capable of restricting the decrease of the breakdown voltage and the increase of the on-resistance.

However, it is preferable to reduce an area of the second AlGaN layer 4b because the on-resistance is increased by the second AlGaN layer 4b. On the other hand, when the area of the second AlGaN layer 4b is reduced, the breakdown voltage is affected. Therefore, it is preferable to design the semiconductor device using a design parameter so as to reduce the on-resistance while securing the desired breakdown voltage, the design parameter including a ratio of the area of the portion including only the single layer of the first AlGaN layer 4a and the area of the portion including the first AlGaN layer 4a and the second AlGaN layer 4b.

A method for manufacturing the above described semiconductor device is basically similar to the conventional method. However, a step for forming the AlGaN layer 4 is different from the conventional method.

The first AlGaN layer 4a and the second AlGaN layer 4b are sequentially stacked on the GaN layer 3 while varying the Al mixed crystal ratio. Then, the second AlGaN layer 4b is etched using a desired mask. As such, the second AlGaN layer 4b is left around a region in which the gate structure portion is to be formed.

The recess 5 is formed by etching with the mask to penetrate the first AlGaN layer 4a from the surface of the second AlGaN layer 4b and to reach the GaN layer 3.

Then, the gate structure portion is formed by conducting a forming step of the gate insulation film, an implanting step of the gate electrode and a patterning step. After that, a forming step of the inter-layer insulation film and a forming step of the source electrode 8 and the drain electrode 9 are conducted, and the semiconductor device of the present embodiment is manufactured.

In the above described method, the Ns is not adjusted by adjusting the thickness of the first AlGaN layer 4a and the second AlGaN layer 4b in the etching. Therefore, the Ns is not largely varied due to the adjustment of the thickness, and well-controllable and stable device characteristics are expected.

In the above described method, an etch stopper may be employed in the etching of the second AlGaN layer 4b, for example, by inserting a thin AlN layer not generating the carriers between the first AlGaN layer 4a and the second AlGaN layer 4b.

(Second Embodiment)

A second embodiment of the present disclosure will be described. In the present embodiment, the configuration of the AlGaN layer 4 is changed from the first embodiment. Since the other parts are similar to the first embodiment, parts different from the first embodiment will be described.

Figure 8:
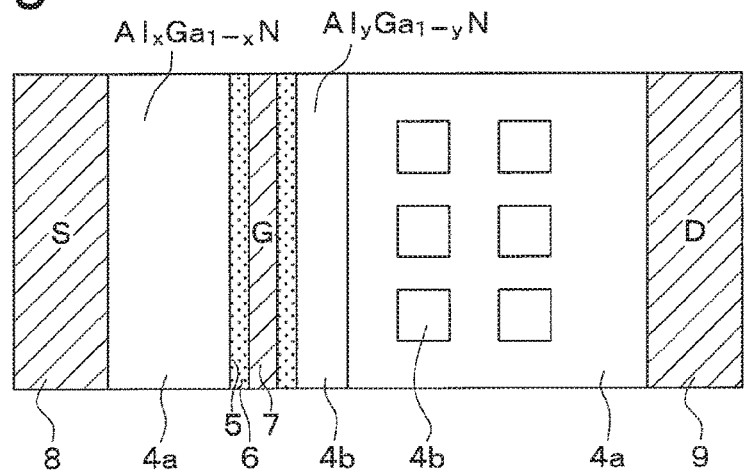
FIG. 8 is a top layout view of a semiconductor device having a horizontal HEMT according to a second embodiment of the present disclosure.

As shown in FIG. 8, in the second embodiment, a part of the second AlGaN layer 4b being in contact with the gate structure portion is provided in the line pattern. A part of the second AlGaN layer 4b being apart from the gate structure portion is not provided in the line pattern but in a dot pattern. Specifically, the second AlGaN layer 4b is divided along a line extending in the horizontal direction of FIG. 8 as well as a line extending in the vertical direction of FIG. 8. The second AlGaN layer 4b is provided in a mesh pattern, in other words, in an island pattern.

When the second AlGaN layer 4b is arranged in the mesh pattern, the area of the second AlGaN layer 4b is reduced compared to the first embodiment. In the region including the second AlGaN layer 4b, the Ns is decreased and the on-resistance is increased. Accordingly, in the present embodiment, the area of the region having lower Ns is decreased by providing the second AlGaN layer 4b in the mesh pattern and thereby to reduce the on-resistance.

(Third Embodiment)

A third embodiment of the present disclosure will be described. Also in the present embodiment, the configuration of the AlGaN layer 4 is changed from the first embodiment. Since the other parts are similar to the first embodiment, parts different from the first embodiment will be described.

Figure 9:
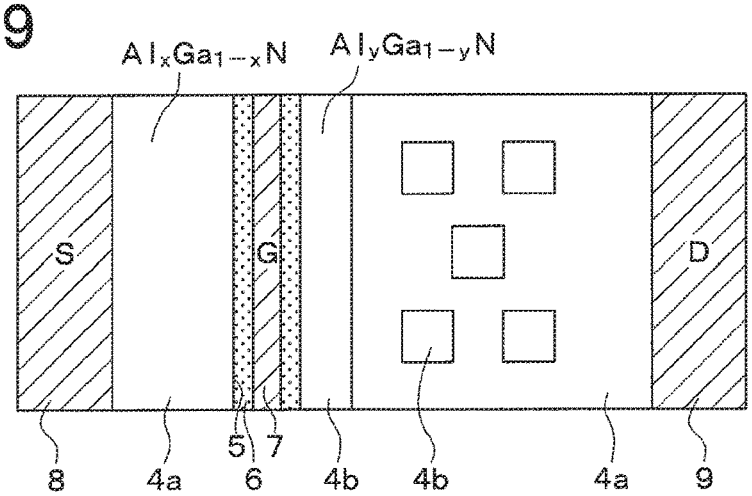
FIG. 9 is a top layout view of a semiconductor device having a horizontal HEMT according to a third embodiment of the present disclosure.

As shown in FIG. 9, in the third embodiment, a part of the second AlGaN layer 4b being in contact with the gate structure portion is provided in the line pattern. A part of the second AlGaN layer 4b being apart from the gate structure portion is provided in a dot pattern. However, the second AlGaN layer 4b is not divided along the line extending in the vertical direction as in the second embodiment, but the second AlGaN layer 4b is provided in a staggered pattern.

Accordingly, in the present embodiment, the area of the second AlGaN layer 4b provided in the staggered pattern is further decreased compared to the second embodiment. Therefore, the on-resistance is further decreased.

(Fourth Embodiment)

A fourth embodiment of the present disclosure will be described. Also in the present embodiment, the configuration of the AlGaN layer 4 is changed from the first embodiment. Since the other parts are similar to the first embodiment, parts different from the first embodiment will be described.

Figure 10:
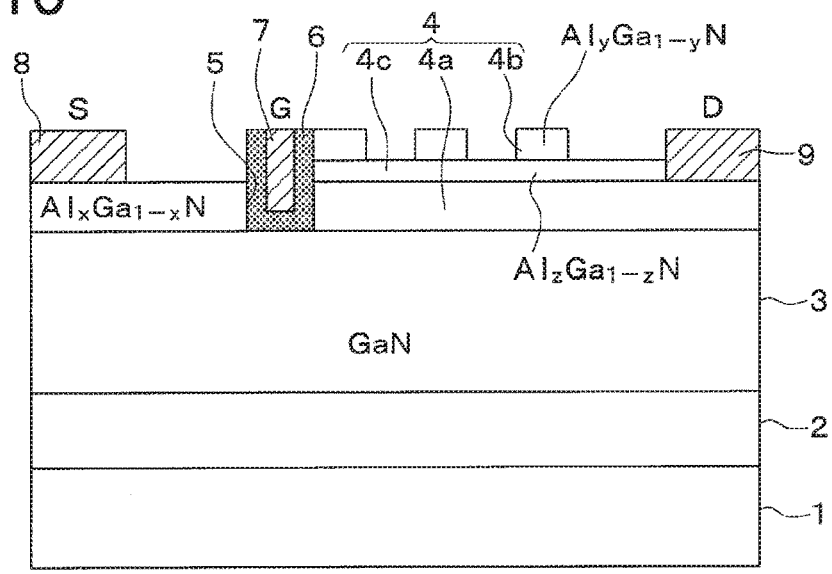
FIG. 10 is a cross-sectional view of a semiconductor device having a horizontal HEMT according to a fourth embodiment of the present disclosure.

As shown in FIG. 10, in the present embodiment, the AlGaN layer 4 includes a third AlGaN layer 4c between the first AlGaN layer 4a and the second AlGaN layer 4b. The third AlGaN layer 4c is formed of $Al_zGa_{1-z}N$ in which z represents Al mixed crystal ratio. The Al mixed crystal ratio z of the third AlGaN layer 4c is larger than the Al mixed crystal ratio x of the first AlGaN layer 4a and the Al mixed crystal ratio y of the second AlGaN layer 4b. The thickness of the third AlGaN layer 4c is thinner than the first AlGaN layer 4a and the second AlGaN layer 4b.

As described above, in the present embodiment, the AlGaN layer 4 includes the third AlGaN layer 4c between the first AlGaN layer 4a and the second AlGaN layer 4b. An etching rate of the AlGaN layer varies depending on the Al mixed crystal ratio and the etching rate is decreased as the Al mixed crystal ratio is increased. Therefore, in the manufacturing process of the semiconductor device, the third AlGaN layer 4c may be used as the etch stopper when the patterning of the second AlGaN layer 4b is conducted by the etching. As such, the patterning of the second AlGaN layer 4b is conducted without etching the first AlGaN layer 4a more certainly.

(Fifth Embodiment)

A fifth embodiment of the present disclosure will be described. Also in the present embodiment, the configuration of the AlGaN layer 4 is changed from the first embodiment. Since the other parts are similar to the first embodiment, parts different from the first embodiment will be described.

Figure 11:
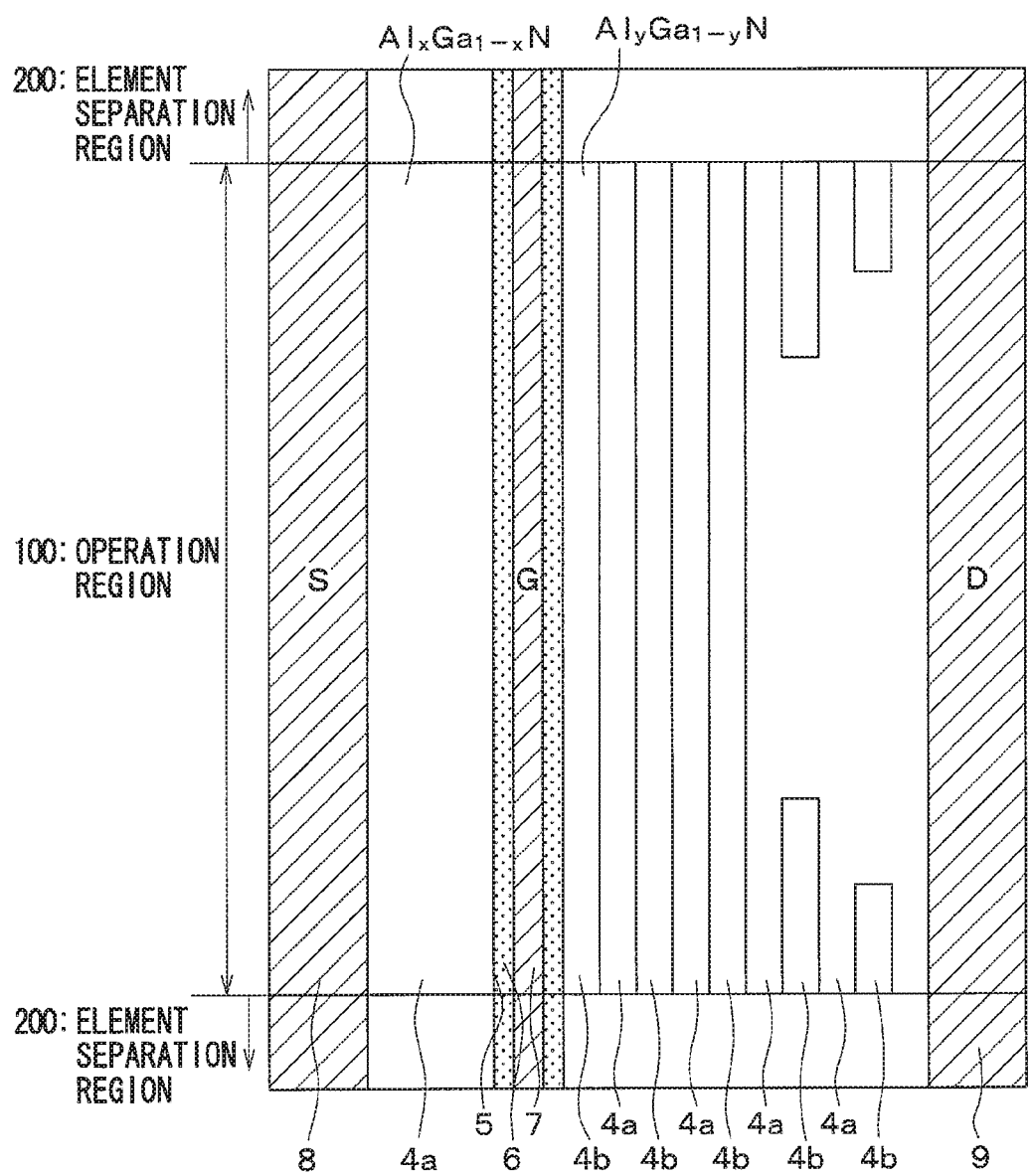
FIG. 11 is a top layout view of a semiconductor device having a horizontal HEMT according to a fifth embodiment of the present disclosure.

As shown in FIG. 11, the semiconductor device includes an operation region 100 in which the horizontal HEMT is formed and that operates as an element, that is, an element formed region. The semiconductor device also includes an element separation region 200 provided out of the operation region 100. At an interface between the element separation region 200 and the operation region 100, the Ns varies largely and the electrical field is likely to be focused.

Therefore, in the present embodiment, the area of the second AlGaN layer 4b is increased toward the element separation region 200. Specifically, as shown in FIG. 11, the number of the divided parts of the second AlGaN layer 4b is increased toward the element separation region 200. At a portion apart from the element separation region 200, that is, at an inside portion of the operation region 100, the number of the divided parts of the second AlGaN layer 4b is a constant number smaller than the portion near the element separation region 200.

When the area of the second AlGaN layer 4b is increased toward the element separation region 200, the variation of the Ns is eased at the interface between the element separation region 200 and the operation region 100. Accordingly, the electrical field intensity is decreased around the interface and the breakdown voltage is further improved.

(Other Embodiment)

The present disclosure is not limited to the above described embodiments and may be suitably modified without departing from the gist of the present disclosure.

For example, in the embodiments, the recess 5 has the depth exposing the surface of the GaN layer 3. However, these are just examples. For example, the recess 5 may have the depth partially removing the surface layer portion of the GaN layer 3. The recess 5 may have the depth leaving the part of the first AlGaN layer 4a so that the 2DEG carriers are not formed at the bottom of the recess 5.

In the embodiments, the second AlGaN layer 4b is formed only between the gate structure portion and the drain electrode 9, and the second AlGaN layer 4b is not formed between the gate structure portion and the source electrode 8. However, these are just examples. For example, the second AlGaN layer 4b may be formed with a specific width from the side surface of the gate structure portion between the gate structure portion and the source electrode 8.

Furthermore, the layouts of the second AlGaN layer 4b described in the embodiments are just examples and other layouts may be adopted. For example, when the second AlGaN layer 4b is arranged in the dot pattern, the pattern is not limited to the mesh pattern or the staggered pattern.

Although the present disclosure is described based on the above embodiments, the present disclosure is not limited to the embodiments and the structures. Various changes and modification may be made in the present disclosure. Furthermore, various combination and formation, and other combination and formation including one, more than one or less than one element may be made in the present disclosure.

The invention claimed is:

1. A semiconductor device comprising
a horizontal switching device that includes:
  a substrate formed of a semi-insulator or a semiconductor;
  a channel forming layer disposed on the substrate and having a hetero-junction structure of a GaN layer and an AlGaN layer, the GaN layer providing an electron transit layer, the AlGaN layer providing an electron donor layer, and the channel forming layer having a recess at which the AlGaN layer is partially removed;
  a gate structure portion having a gate insulation film and a gate electrode, the gate insulation film being disposed in the recess, and the gate electrode being disposed on the gate insulation film; and
  a source electrode and a drain electrode disposed on the channel forming layer, the gate structure portion being positioned between the source electrode and the drain electrode,
the horizontal switching device generating a current between the source electrode and the drain electrode by a channel formed at a surface layer portion of the GaN layer positioned below a bottom of the recess when a 2-dimensional electron gas carrier is induced in the GaN layer adjacent to an interface between the GaN layer and the AlGaN layer and a voltage is applied to the gate electrode, wherein
the AlGaN layer includes a first AlGaN layer and a second AlGaN layer,
the first AlGaN layer has a first Al mixed crystal ratio determining a 2-dimensional electron gas concentration of the first AlGaN layer,
the second AlGaN layer is positioned between the gate structure portion and the drain electrode,
the second AlGaN layer is divided into multiple parts in an arrangement direction in which the gate structure portion and the drain electrode are arranged,
the second AlGaN layer has a second Al mixed crystal ratio determining a 2-dimensional electron gas concentration of the second AlGaN layer, and
the second Al mixed crystal ratio is less than the first Al mixed crystal ratio so that the second AlGaN layer induces a minus fixed charge.

2. The semiconductor device according to claim 1, wherein
the gate structure portion, the source electrode and the drain electrode are provided in a line pattern extending in one direction parallel to a surface of the substrate, and
the second AlGaN layer is provided in the line pattern extending in the one direction.

3. The semiconductor device according to claim 1, wherein
the gate structure portion, the source electrode and the drain electrode are provided in a line pattern extending in one direction parallel to a surface of the substrate, and
the second AlGaN layer is provided in a dot pattern.

4. The semiconductor device according to claim 3, wherein
the second AlGaN layer is provided in the dot pattern in which the second AlGaN layer is divided into multiple parts along a line extending in the one direction.

5. The semiconductor device according to claim 3, wherein
the second AlGaN layer is provided in the dot pattern in which the second AlGaN layer is arranged in a staggered pattern.

6. The semiconductor device according to claim 1, wherein
the AlGaN layer includes a third AlGaN layer positioned between the first AlGaN layer and the second AlGaN layer, and
the third AlGaN layer has a third Al mixed crystal ratio that is greater than the first Al mixed crystal ratio of the first AlGaN layer and greater than the second Al mixed crystal ratio of the second AlGaN layer.

7. The semiconductor device according to claim 1, comprising:
an operation region in which the horizontal switching device is provided and that operates as an element; and
an element separation region that is positioned out of the operation region, wherein
an area of the second AlGaN layer is increased toward the element separation region.

8. The semiconductor device according to claim 1, wherein
the 2-dimensional electron gas concentration of the first AlGaN layer is increased as the first Al mixed crystal ratio is increased, and the 2-dimensional electron gas concentration of the second AlGaN layer is increased as the second Al mixed crystal ratio is increased.

9. The semiconductor device according claim 1, wherein
the second AlGaN layer is divided into the multiple parts in the arrangement direction of the gate structure portion and the drain electrode, and
the multiple parts are apart from each other.

10. The semiconductor device according to claim 1, wherein
the first AlGaN layer is disposed on the GaN layer, and
the second AlGaN layer is disposed on the first AlGaN layer.

* * * * *